United States Patent [19]
Clark

[11] Patent Number: 5,214,682
[45] Date of Patent: May 25, 1993

[54] HIGH RESOLUTION DIGITALLY CONTROLLED OSCILLATOR

[75] Inventor: Lawrence T. Clark, Tempe, Ariz.

[73] Assignee: VLSI Technology, Inc., San Jose, Calif.

[21] Appl. No.: 815,098

[22] Filed: Dec. 27, 1991

[51] Int. Cl.⁵ .............................................. H03K 21/02
[52] U.S. Cl. ........................................ 377/56; 377/47; 377/48
[58] Field of Search ............................. 377/56, 47, 48

[56] References Cited

U.S. PATENT DOCUMENTS

| | | | |
|---|---|---|---|
| 4,042,973 | 8/1977 | Caulfield et al. | 377/47 |
| 4,656,649 | 5/1987 | Takahashi | 377/48 |
| 4,947,411 | 8/1990 | Shiraishi et al. | 377/47 |
| 4,991,187 | 2/1991 | Herold et al. | 377/48 |

OTHER PUBLICATIONS

Phase-Locked Loops, Best, McGraw-Hill, New York, 1984, pp. 103-109.

*Primary Examiner*—William L. Sikes
*Assistant Examiner*—Scott A. Ouellette
*Attorney, Agent, or Firm*—LaValle D. Ptak

[57] ABSTRACT

A high resolution digitally controlled oscillator is in the form of a digital frequency divider, which uses calculation logic to utilize both the rising edge and the falling edge (start edge and stop edge) of the input clock pulses to provide the capability of alternating between two adjacent frequencies. This results in significantly improved resolution, since the division ratio is not dependent upon any integral number of clock periods.

15 Claims, 8 Drawing Sheets

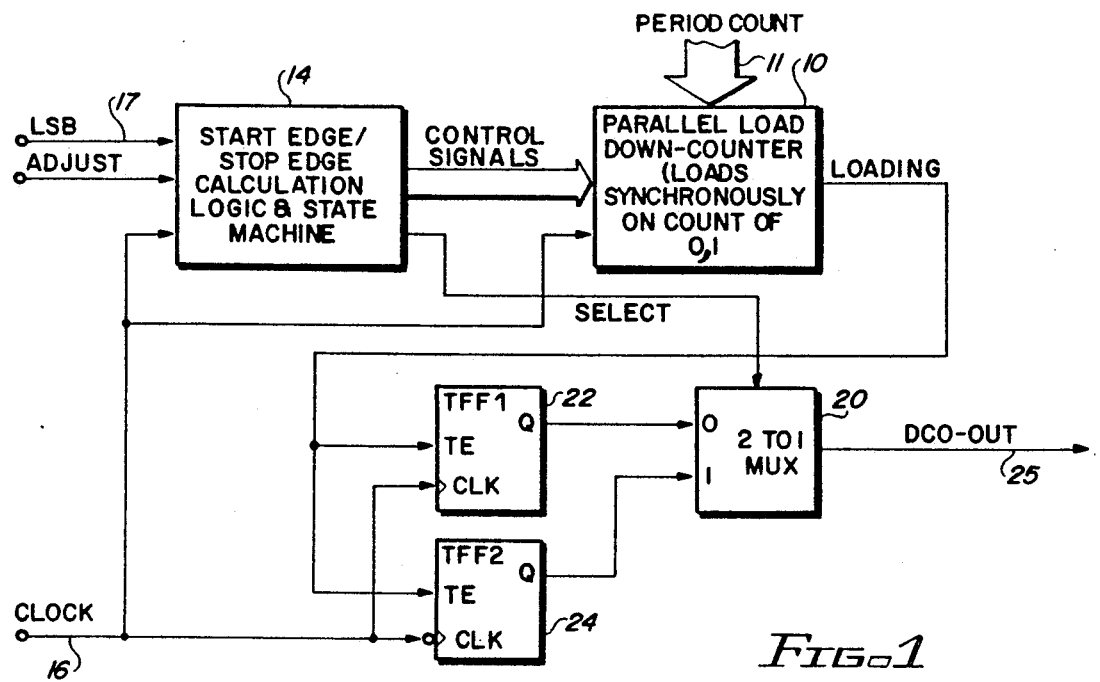
FIG. 1
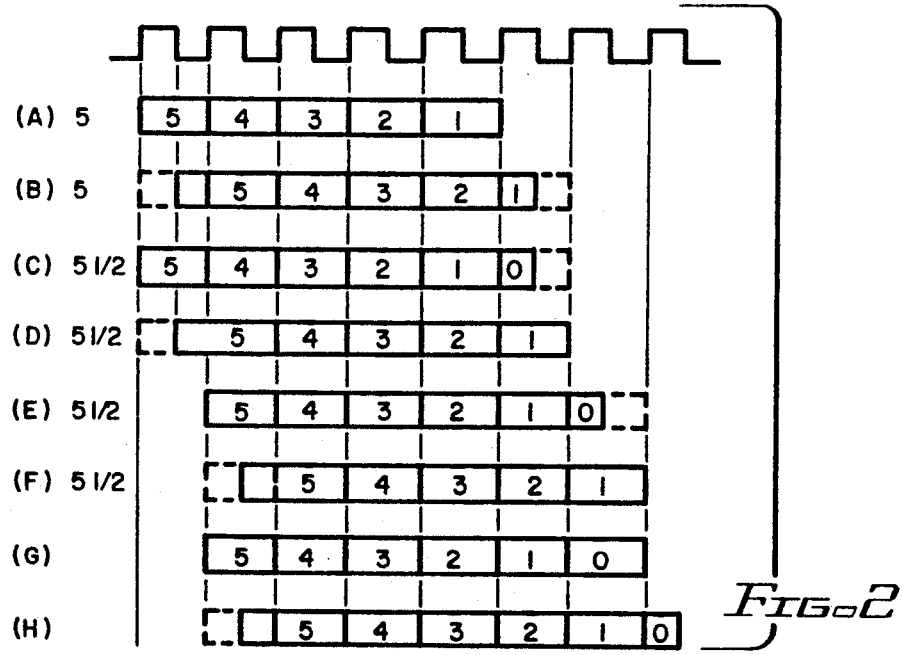
FIG. 2
| CASE | LAST SE | SE | LAST LSB | LAST ADJ. | COUNT TO STOP ON |
|------|---------|----|----------|-----------|-------------------|
| A | 0 | 0 | 0 | 0 | 1 |
| B | 1 | 1 | 0 | 0 | 1 |
| C | 0 | 1 | 1 | 0 | 0 |
| D | 1 | 0 | 1 | 0 | 1 |
| E | 0 | 1 | 0 | 1 | 0 |
| F | 1 | 0 | 0 | 1 | 1 |
| G | 0 | 0 | 1 | 1 | 0 |
| H | 1 | 1 | 1 | 1 | 0 |
FIG. 3

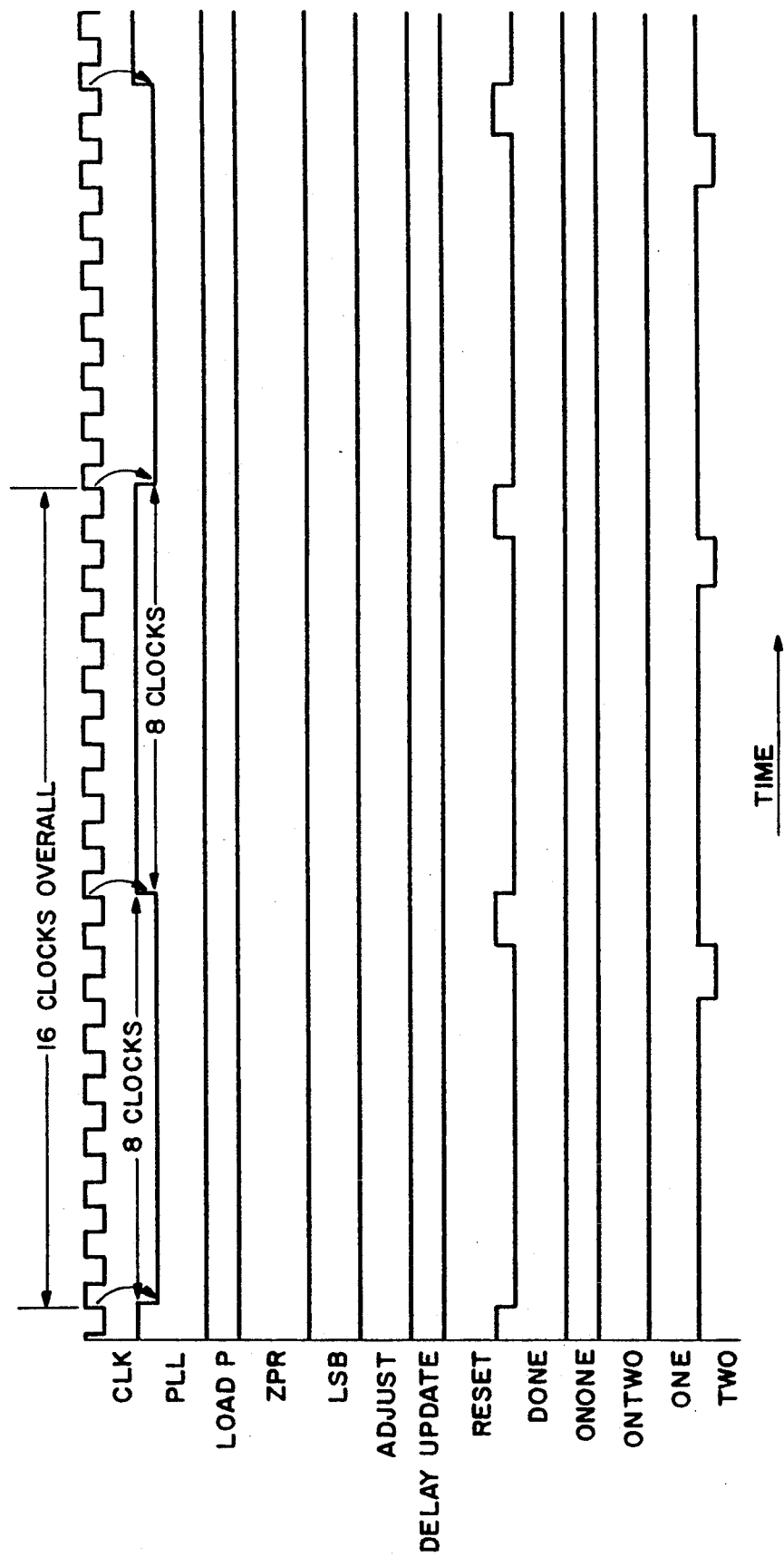

OPERATION WITH LSB=1 & ADJUST=0

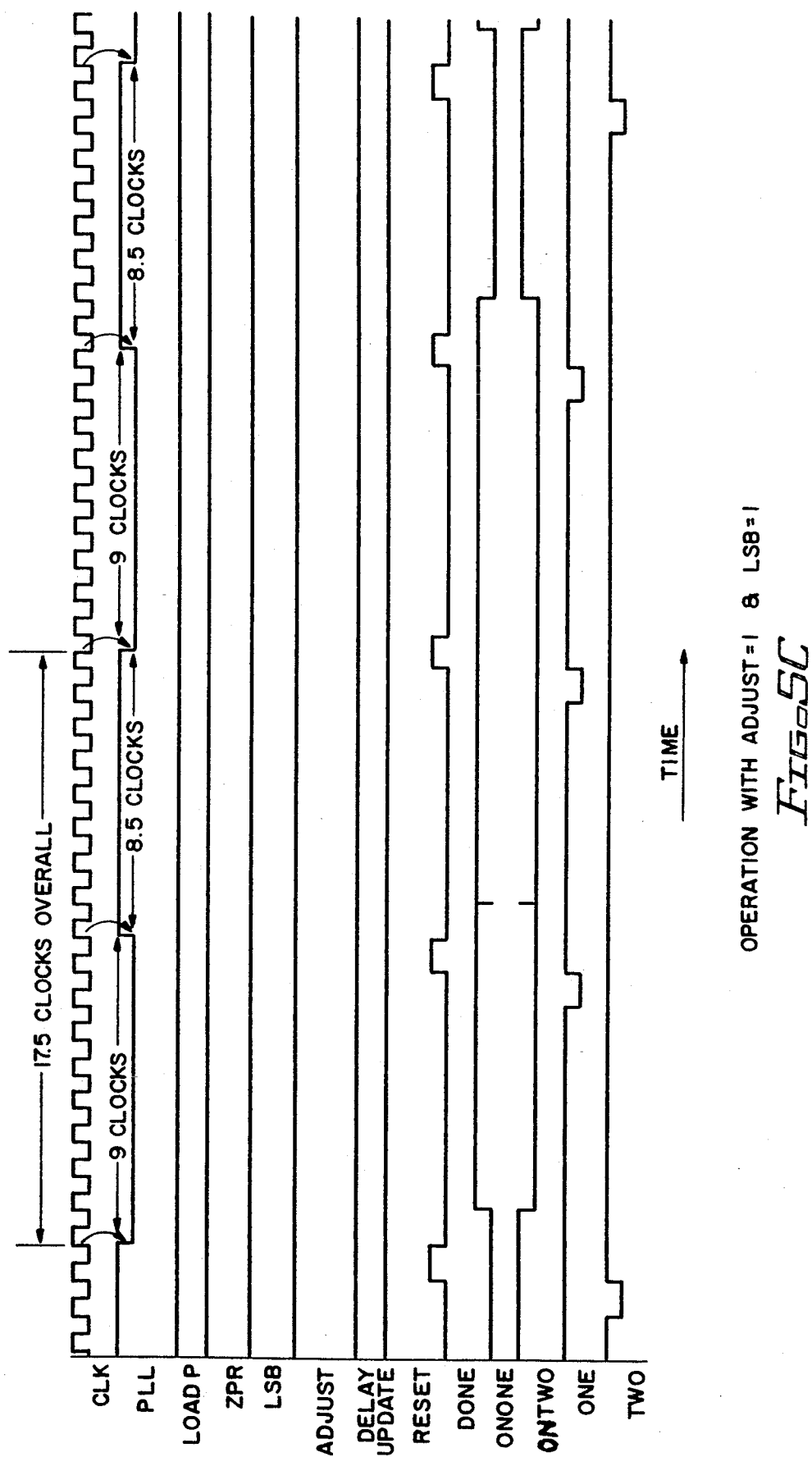

ZERO PHASE RESTART BEHAVIOR

HIGH RESOLUTION DIGITALLY CONTROLLED OSCILLATOR

BACKGROUND

Digitally controlled oscillators (DCO) are increasingly being used in phase locked loop (PLL) systems in a variety of applications. The basic, digitally controlled oscillator employs a divide-by-N counter, to which fixed frequency clock pulses are applied. The loop filter of the phase locked loop, in which the system is used, provides signals to the divide-by-N counter to cause the output signal to comprise a division in which the output frequency consists of an even number of input clock pulses. The output waveform has a symmetrical duty cycle; but the resolution is limited by the frequency of the clock signals, and the necessity for an even number of clock signals to appear in each cycle of the output signal.

A modified divide-by-N counter has been developed, which provides greater resolution than the above-described divide-by-N counter. Such a modified divide-by-N counter is capable of producing an output frequency of any number of clocks (odd or even). The result is that the duty cycle of the output signal is not always symmetrical; but for phase locked loop systems this generally is not a factor. Although a significant improvement in the foregoing system is provided with such a modified divide-by-N counter system, it still is necessary for each half-cycle of the output waveform to comprise an integral number of complete clock waveform cycles. For example, one-half cycle of the output waveform could include two full cycles of the input clock signal; and the other half-cycle of the output waveform could include three full cycles of the input clock signal, for a total of five clock signals for each complete cycle of the output waveform. The system also is capable of producing symmetrical waveforms, in which the same number of clock pulses or clock signal cycles are present in each half of the divided-down output waveform cycle.

Other types of digitally controlled oscillators have been developed, such as increment/decrement counters and waveform synthesizers. The increment/decrement counter operates in conjunction with loop filters, which generate carry and borrow pulses. In the absence of any carry and borrow pulses, the counter divides the input frequency by a factor of 2. Whenever a carry pulse appears at the input, an additional clock cycle is added by the increment/decrement counter. Similarly, whenever a borrow pulse appears on the input, the increment/decrement counter deletes a clock cycle from the output produced by the counter. It is readily apparent that the output frequency of the digitally controlled oscillator, therefore, is controllable within a range given by the maximum frequency of the carry and borrow pulses.

Waveform synthesizers are complex to implement in hardware. Consequently, they are most suited for software implementation. The counter or divider circuit for a waveform synthesizer type of digitally controlled oscillator operates at a fixed clock rate or sampling rate to calculate a sample of the synthesized signal at the different sampling instants. A system of this type produces lower frequency signals, with higher resolution than higher frequency signals.

It is desirable to provide a digitally controlled oscillator circuit, which is relatively easy to implement in hardware, and which provides a higher resolution than the prior art digitally controlled oscillators or frequency divider circuits discussed above.

SUMMARY OF THE INVENTION

It is an object of this invention to provide a high resolution digitally controlled oscillator.

It is another object of this invention to provide a digitally controlled oscillator capable of use in a digital PLL, which has a resolution greater than the clock period.

It is another object of this invention to provide a high resolution digitally controlled oscillator employing a frequency divider circuit responsive to clock pulses for changing the binary state of the output of the frequency divider in response to selected ones of the rising edges and falling edges of the clock pulses.

In accordance with a preferred embodiment of the invention, a high resolution digitally controlled oscillator includes a source of clock pulses, each having a rising edge and a falling edge. A frequency divider circuit responds to these clock pulses, and is provided with control signals for causing the divider circuit to change the binary state of the output signal in response to selected ones of the rising edges or to falling edges of the clock pulses. As a consequence, the resolution of the oscillator circuit is significantly improved (2×), since it does not require an integral number of clock pulses for each cycle of the output signal waveform. Additionally, provision is made to vary the duty cycle of the waveform by ½ clock cycle, increasing the resolution to four times (4×) for some applications (those not requiring a 50% duty cycle).

BRIEF DESCRIPTION OF THE DRAWINGS

FIG. 1 is a block diagram of a preferred embodiment of the invention;

FIGS. 2 and 3 comprise a timing diagram and analysis table, respectively, useful in explaining the operation of the system of FIG. 1;

FIGS. 5A through 5E are waveforms representative of the signals at various portions of the circuit shown in FIG. 4.

DETAILED DESCRIPTION

Reference now should be made to the drawings, in which the same reference numbers are used in FIGS. 1 and 4 to designate the The circuit shown in FIG. 1 is a high resolution digitally controlled oscillator (DCO), which allows construction of digital phase-locked loops having a greater degree of precision than those utilizing a conventional DCO. An application, with which the circuit of FIG. 1 is primarily well suited, is the synchronization of MFM encoded data on a floppy diskette read channel. For such applications, the phase-locked loop (PLL) must run at twice the data rate. As an example, consider a system having a 25 MHz clock. A conventional DCO can exactly generate frequencies of one MHz, 1.042 MHz, 1.087 MHz, etc. As a result, a PLL using a conventional DCO can exactly match 500 kilobits per second, 520.8 kilobits per second, 543.5 kilobits per second, etc., data rates.

Figure 4A:
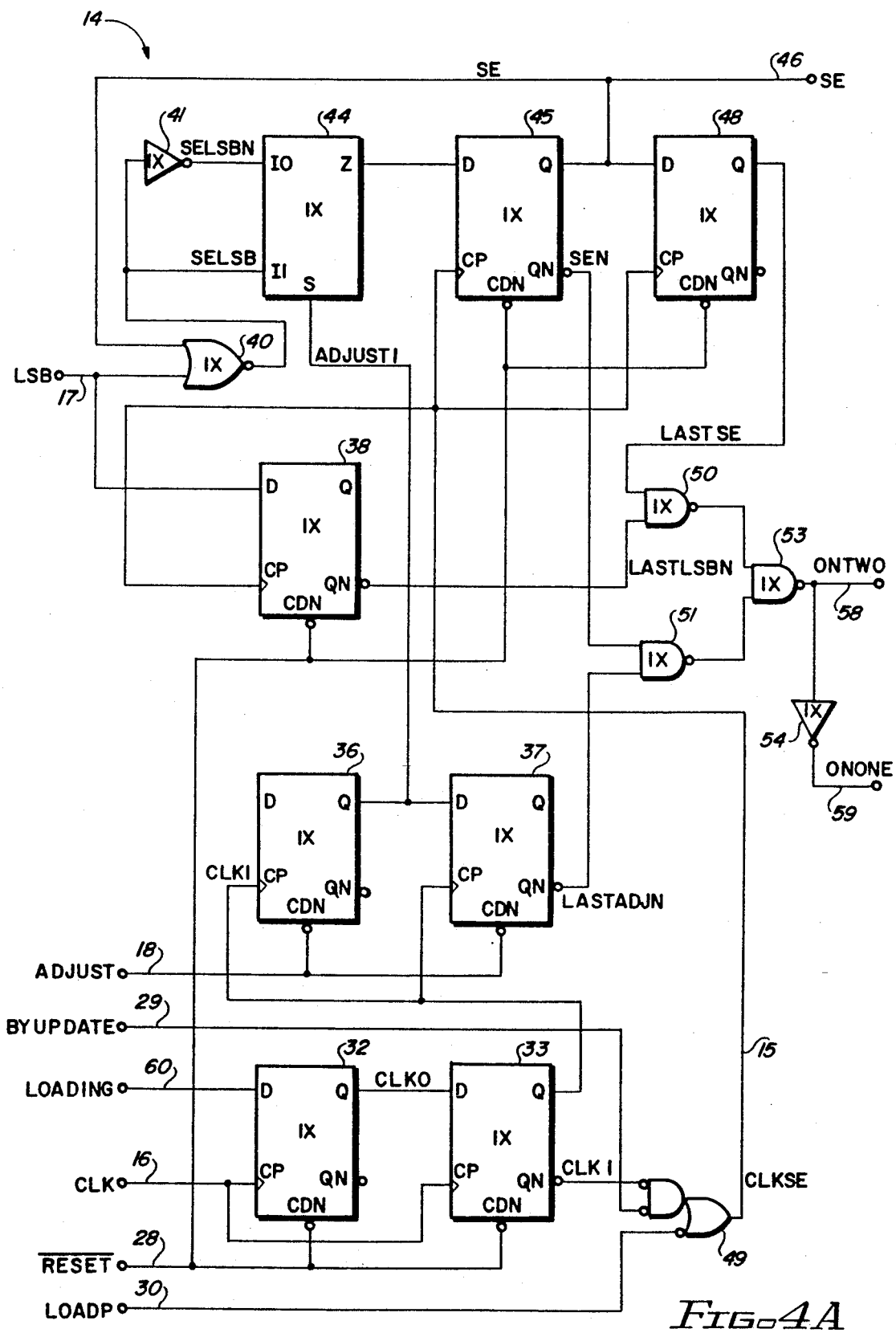
FIGS. 4A, 4B and 4C, together, comprise a detailed schematic block diagram of the embodiment shown in FIG. 1.
Figure 4B:
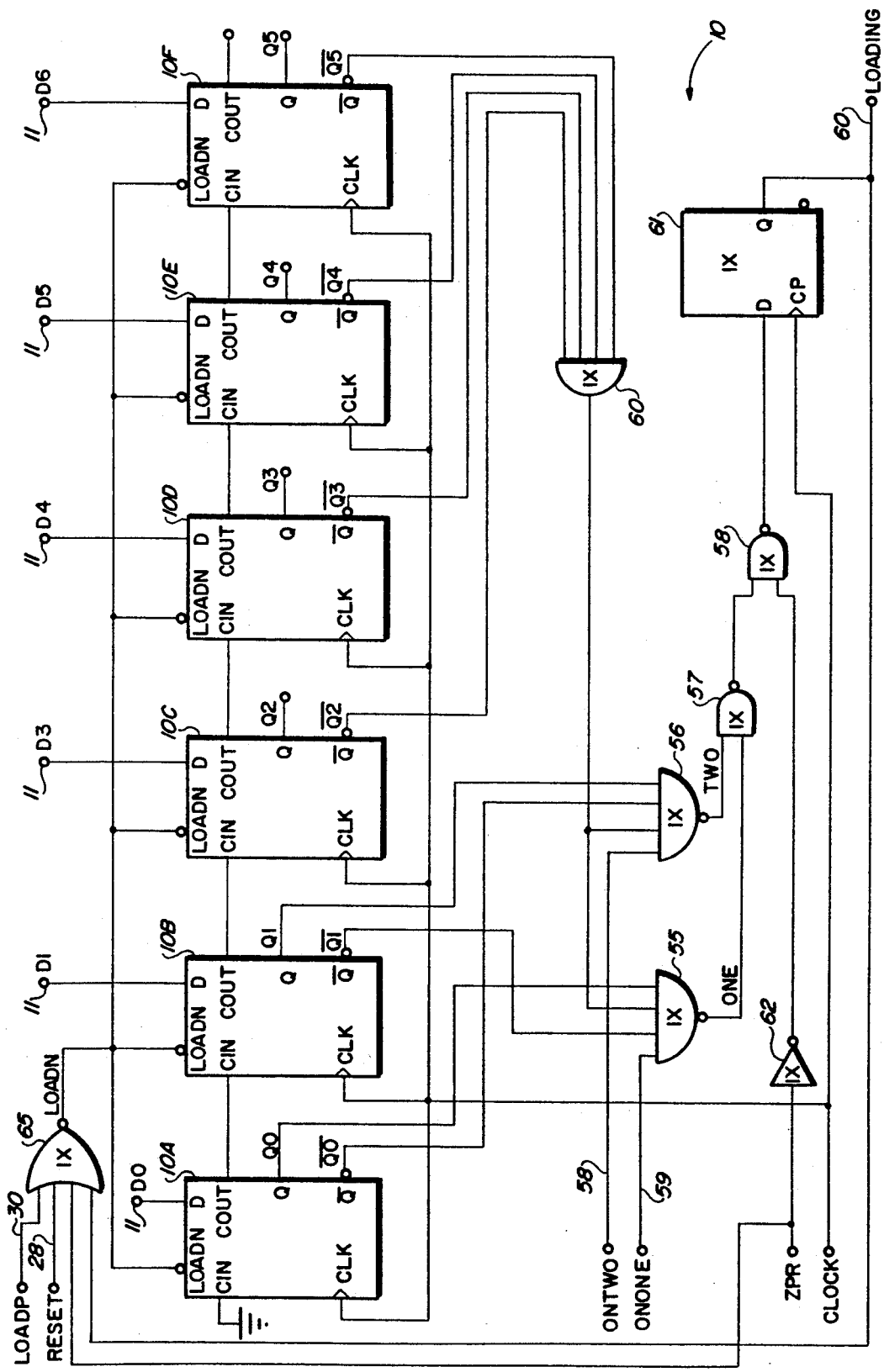

In contrast, the circuit shown in FIG. 1, and shown in greater detail in FIGS. 4A and 4B, can exactly generate 1 MHz, 1.020 MHz, 1.042 MHz, etc. The circuit shown in FIG. 1 employs start-edge/stop-edge or rising-edge/falling-edge calculation logic, using both of the clock edges for switching the output of the divider circuit. This provides the system with the capability of alternating between two adjacent frequencies. This is done without the use of any analog devices. A PLL using the DCO circuit shown in FIG. 1 can exactly match 500 kilobits per second, 505 kilobits per second, and 510 kilobits per second, etc.

As is apparent from the subsequent description, the duty cycle of the signal is not fifty percent in the alternating frequencies. As a result, the phase is off by one-fourth clock on every other cycle. As a DCO in a phase-locked loop system, however, this has no impact on the intended application. The greater precision which is obtainable from the circuit results in a significant improvement in resolution, which, in turn, greatly improves the digital phaselocked loop performance of the system in which the oscillator or divider circuit, shown in FIG. 1, is used.

Also, before entering into a discussion of the specific circuit shown in FIG. 1, it should be noted that the other elements of the phase-locked loop, such as the phase detector and up/down counter, may be of any suitable configuration. Consequently, those portions of a phase-locked loop, with which this digitally controlled oscillator (DCO) may be used, have not been shown.

Referring now to FIG. 1, a buffer register in the form of a parallel load down-counter 10 is supplied with a count representative of the division ratio or division timing over a group of output leads 11, identified in FIG. 1 as "period count". The input to the buffer counter 10 is obtainable from any standard digital filter of the type used in conjunction with digital phaselocked loop circuits where the filter output is the required period. As is well known, this is a function of the operation of the phase error detected by the PLL. These components have not been shown, as mentioned above, since they may be of any of a number of different standard configurations.

The clock signals, which are employed to generate the digital controlled output signal, are obtained over a lead 16. In a digital circuit, such as commonly found in a personal computer or the like, these clock signals are derived from a central clock, and are applied over a lead 16, as shown in FIG. 1. The clock signals applied to the terminal 16 are at a frequency which is considerably greater than the frequency of the digitally controlled oscillator. These clock signals are applied to the counter 10 to control the operation of the loading to and counting of the counter 10.

An additional start-edge/stop-edge calculation logic and state machine circuit 14 also is provided. This circuit includes two other binary input signals, LSB, and ADJUST, applied over a pair of inputs 17 and 18, respectively. These two signals "LSB" and "ADJUST" constitute additional division control signals from the normal integer division number typically used for the DCO of a standard digital phase-locked loop system. The division number 14 "N", which is used in conjunction with the circuit shown in FIG. 1, is N=XXX.XX. Each of the letter "X's" represent a binary number to provide the desired division ratio. The two binary positions to the right of the decimal point constitute the inputs "LSB" on lead 17 and "ADJUST" on lead 18, as described above. These are binary decimal places designating one-half and one-fourth, respectively, in the binary positions of the full number constituting the division number "N".

The specific nature of the binary signals applied on the leads 17 and 18 determines the period and duty cycle of the generated DCO output appearing on the terminal 25. The state machine circuit logic determines the next final output clock edge from the clock signals applied on the lead 16, based on the signals LSB, ADJUST, and on the current stop (start) or falling (rising) clock edge. Specifically, the signal LSB applied on the lead 17 represents that the desired period of the generated output signal is N½ clocks or clock signal cycles. The signal "ADJUST" applied on the lead 18 represents that the duty cycle should vary by plus one-half clock every other cycle whenever this signal is asserted. This "ADJUST" feature allows the DCO to have a greater than one-half clock period resolution in tracking any specific frequency. The result of this is that the "jitter" or hunting up and down of the DCO output signal is significantly reduced over standard circuits, which do not have this capability of adjusting the period and duty cycle of the generated output in terms of one-half clock cycles.

The outputs of the state machine circuit are applied to the counter 10, and control the synchronous load counter 10, as well as the select logic over the lead "SELECT" applied to a two-to-one multiplex circuit 20.

The inputs to the multiplexor circuit 20 are obtained from a pair of toggle flip-flops 22 and 24, each of which are provided with the "loading" output of the counter 10 on their enabled inputs. The clock inputs to the toggle enable flip-flops 22 and 24 are obtained from the same source of clock signals on the lead 16, which are used to operate the counter and the circuit 14. The clock signals applied to the terminal 22 are the normal clock signals, whereas the clock signals applied to the clock input of the toggle flip-flop 24 are inverted, as is indicated at the input to the flip-flop 24. Consequently, the actual clock signals applied to the flip-flops 22 and 24 are exactly 180° out of phase with one another. The result is that the multiplex circuit 20 changes the signal transition of the output signal on the DCO output terminal 25, on either the rising edge or the falling edge (start edge or stop edge) of the clock signals, in accordance with the output of one or the other of the toggle flip-flops 22 and 24, as selected by the SELECT output from the state machine circuit 14.

FIGS. 2 and 3 illustrate, diagrammatically, the effect of such an operation. In FIG. 2, the top horizontal row of pulses constitutes a typical square-wave clock pulse sequence, in which the duty cycle of the clock pulses is a fifty percent duty cycle. Located in the rows labeled with the letters "A" through "H" below the clock pulse sequence, and arranged in accordance with the same time frame shown for the clock pulse signal of the upper row, different examples of the operation of the system for producing the DCO output signal on the lead 25 are illustrated. As illustrated in FIG. 2, the loading of the download counter 10 through the toggling of the flip-flops 22 and 24, and, ultimately, to pass a signal through the multiplex 20, may be effected after a binary count of "1" or "0". In FIG. 2, the loading or pre-load of the output of the counter 10 is effected after a binary count of "1" for the cases "A", "B", "D", "F". Similarly, the loading for examples "C", "E", "G", and "H" takes place after a count of "0", as illustrated in FIG. 2.

The determination for effecting the counts to result in the half-cycle signal lengths and positioning, as indicated in FIG. 2, is illustrated in the table of FIG. 3. This table, on the left-hand side, shows the different cases corresponding to those of FIG. 2, using the same letter designations. The next column, entitled "LAST SE" is an indication of the previous stop (start) edge, on which the count was terminated, to effect the loading from the counter 10. The next column "SE" is the current start (stop) edge. This information then is considered in conjunction with the last "LSB" binary designation, which is shown in that column. The next column indicates that last ADJUST (ADJ) binary signal, while the right-hand or final column indicates the count on which the circuit stops the count to form the different lengths and positions illustrated in FIG. 2. It should be noted that some of the binary bits or positions are stretched or elongated, whereas others are shortened. The elongation and the shortening is effected on the bits located at the opposite end of the count, as is readily apparent from an examination of FIG. 2.

Reference now should be made to FIG. 4 (illustrated in two parts, 4A and 4B). This figure is a more detailed circuit block diagram of the DCO system shown in FIG. 1. The inputs and those components, which are the same in FIGS. 1, 4A and 4B, have the same reference numbers. It should be noted, again, that the signals applied to the leads "LSB" 17 and "ADJUST" 18 affect the desired precision of the division ratio which is effected by the circuit shown in FIGS. 4A and 4B. The manner in which these two signals are generated is not of consequence, with respect to an understanding of the circuit of FIGS. 4A and 4B. It is important to note, however, that they do represent the two binary decimal places described above, and, consequently, are employed to effect the specific half-cycle clock switching and period variation described in conjunction with FIG. 1. The two portions of the circuit of FIGS. 4A and 4B should be considered together, and are described together in the ensuing description.

The parallel load down counter 10 is shown in the upper righthand portion of FIG. 4B as comprising six interconnected binary stages 10A, 10B, 10C, 10D, 10E, and 10F. In actual applications, more stages may be used, but the operating principles of the invention are illustrated, without undue clutter, by the six stages shown. The period count input 11 of FIG. 1 is illustrated as appearing on six leads individually connected to the "D" inputs of each of the six stages 10A through 10F. The clock pulses applied on the clock pulse lead 16 are obtained from a clock buffer which is external to the circuit of FIG. 4. These clock input pulses are illustrated as applied in the lower left of FIG. 4A.

Figure 4C:
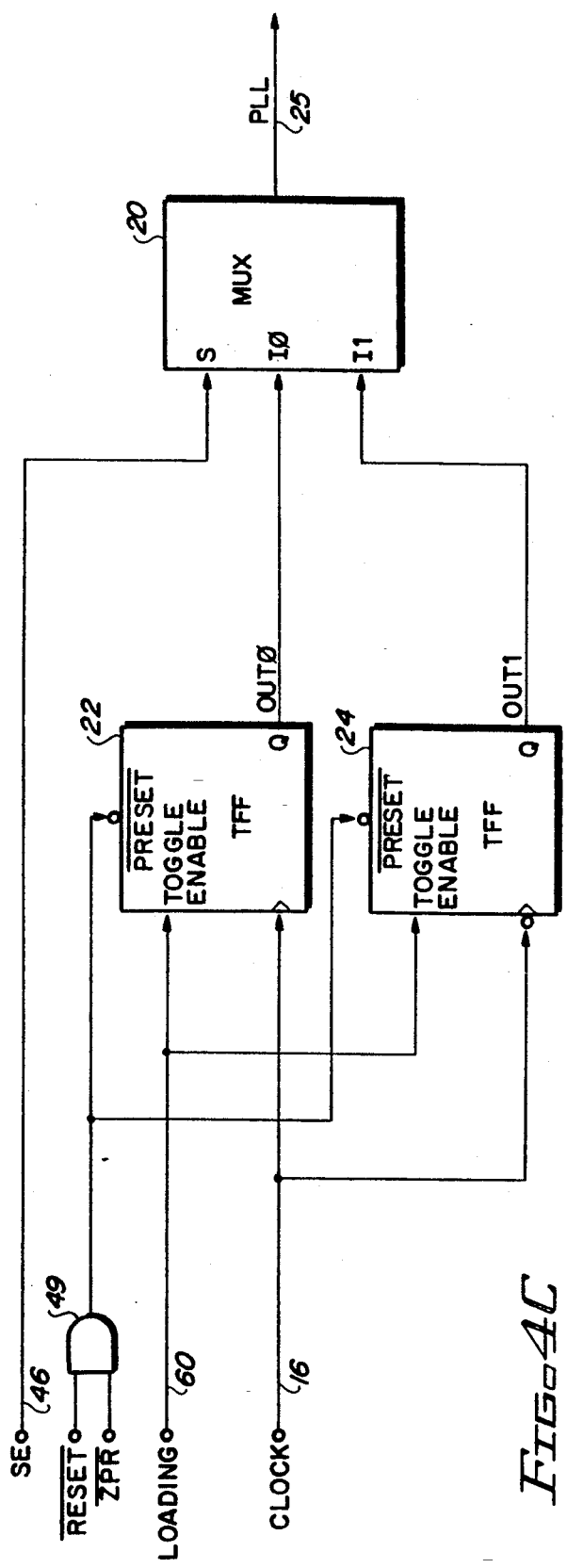

The start-edge/stop-edge calculation logic and state machine circuit 14 of FIG. 1 is illustrated, primarily, in FIG. 4A. This circuit comprises a pair of cascaded D flip-flops 32 and 33, each of which respond to the normal clock pulses appearing on the lead 16. These flip-flops, along with other circuit components shown in FIGS. 4A, 4B, and 4C, are initially set to a reset or initial condition of operation by means of reset pulses applied over a lead 28. Assume for the purposes of the present discussion, that the reset pulse on the lead 28 already has appeared. This pulse, like the clock pulses on the lead 17 and the "LSB" and "ADJUST" pulses are obtained from circuitry not shown. Reset pulses commonly occur in a digital phase-locked loop system between the fields to be synchronized to, and are generated in a manner well known to those skilled in the art. Consequently, the source of these pulses has not been illustrated, since it is not necessary for an understanding of the operation of the specific divider circuit comprising the digitally controlled oscillator which is shown in FIG. 4.

The flip-flop 32 is enabled from the "pre-load counter" output subsequently. The output of the flip-flop 32 then, in turn, is cascaded to the "D" or enable input of the flip-flop 33; so that of the flip-flop 33 comprises "clock 1" (last clock). The buffered or delayed clock pulses from the flip-flop 33 then are applied as clock input signals to two other toggle or D-type flip-flops 36 and 37, as shown in FIG. 4A, to trigger these flip-flops to the state designated by the inputs on the "D" enable terminals thereof. This is with the exception of the flip-flop 36, which is a buffer or toggle flip-flop, which changes state upon the application of each clock pulse applied to it.

Three additional flip-flops 38, 45 and 48, are used in controlling the phase adjustment of the system. Clock pulses for these flip-flops are obtained from a complex AND-OR gate 49 to respond to the "CLK 1" output of the flip-flop 33. The gate 49 functions to disable this delayed clock "CLK 1" from affecting the flip-flops 38, 45 and 48 on cycles which include the phase adjustment. This is to avoid clocking the data twice in one cycle, since the phase adjust operation is performed in the middle of the cycle, and not between cycles; and the phase adjusted data constitutes the next input. To effect a phase-adjusted cycle, "CLK 1" is disabled by assertion of a "delay-update" signal 29 applied to one of the inputs of the AND-OR gate 49.

The counter 10 is pre-loaded, and begins counting down in the normal fashion. After some predetermined number of clocks, "LOADP" is asserted, pre-loading the counter with its current count plus or minus the required phase adjustment value, while the flip-flops 38, 45, and 48 are updated. The signal on the "LOADP" terminal 30 is active during one clock edge only, and the counter 10 continues counting down. Note that there are restrictions on the lowest count value, that is it must be greater than or equal to "2" to allow proper pre-load operation of the counter. This is effected by circuitry which is external to the oscillator shown in FIG. 4.

The binary "ADJUST" signals appearing on the lead 18 are applied to the reset inputs of the flip-flops 36 and 37 to change or modify the states of these flip-flops, in accordance with signals appearing on the ADJUST terminal whenever those signals appear. The "LSB" signals appearing on the lead 17 are applied directly to the D or enable input of the flip-flop 38, which provides a signal on its normal or "Q" output representative of the "last LSB" signal (mentioned above in the discussion of table of FIG. 3). The inverted output of the flip-flop 38 "Q NOT" also is utilized. The inverted output of the flip-flop 38 is applied as one of two inputs to a NAND gate 50. Similarly, the inverted output of the flip-flop 37, which represent the inverted last "ADJUST" signal, is applied to one input of the NAND gate 51.

The "LSB" input signals on the lead 17 also are applied to one of two inputs of an exclusive NOR gate 40, the other input of which is the normal output of the flip-flop 45. The normal output of the NOR gate 40 is applied to the input "1", and the inverted output of the NOR gate 40 is applied through an invertor 41 to the input "0" multiplexor 44. Thus, one or the other of these inputs is enabled " by the "ADJUST" output of the flip-flop 36 whenever that output occurs.

The output of the multiplexor 44 then constitutes the input applied to the "D" input of the D-type flip-flop 45 to produce the "SE" (start/stop edge) signal from the flip-flop 45. This is obtained from the "Q" output of the flip-flop 45, and constitutes the second input to the exclusive NOR gate 40. This input also comprises the input to a cascaded flip-flop 48; so that the output of the flip-flop 48 constitutes the "last SE" stop/start edge signal to which reference is made in the table of FIG. 3. The inverted "SE" (select) output and the normal "last SE" output from the flip-flops 45 and 48, respectively, comprise the other of the two inputs to the NAND gates 50 and 51. The outputs of the NAND gates 50 and 51 are applied to the inputs of a NAND gate 53, which supplies an output "on two" on a lead 58 to one of four inputs of a NAND gate 56. The output of the NAND gate 53 also is inverted by an inverter 54 and is designated "on zero", and is applied over a lead 59 as one of the four inputs to a second NAND gate 55 (FIG. 4B). As is readily apparent from an examination of the circuit of FIG. 4B, the other inputs to the NAND gates 55 and 56 include the two low order bit values from the counter, stages 10A and 10B. The inverted output of the stage 10A is applied as one of the inputs to the NAND gate 55, whereas the normal output of the stage 10A is applied as one of the inputs to the NAND gate 56. The inverted output of the stage 10B is applied to inputs of both gates 55 and 56. The fourth and final input to the NAND gates 55 and 56 is obtained from an AND gate 60, which has inputs connected, respectively, to the inverted outputs of the stages 10C and 10D of the counter 10. Thus, this input represents the status of the high order bits of the count in the counter.

The outputs of the NAND gates 55 and 56 then are supplied as the two inputs to a third NAND gate 57. The output of the NAND gate 57 comprises the counter load or "pre-load counter" pulse, generated one clock in advance of that actually required. A delay flip-flop 61 functions to preclude erroneous output signals from appearing on the output of the NAND gate 57 to cause erroneous preload signal "loading". The signal "ZPR", which is inverted by an inverter 62, operates through an NAND gate 58 to disable pre-loading of the counter during a "zero phase restart" operation. This is necessary to avoid two consecutive assertions of "loading", which otherwise would result in a short (erroneous) cycle of the digitally controlled oscillator (DCO).

The "pre-load counter" pulse is illustrated in FIG. 1 as "loading" applied to the enable flip-flops 22 and 24. These flip-flops also are shown in FIG. 4C, and the output of the flip-flop 61 is applied directly to the enable input of the flip-flop 22, and flip-flop 24, the other input to which comprises the inverted clock signal appearing on the lead 16. The normal outputs of the flip-flops 22 and 24 are applied to the inputs "I0" and "I1", respectively, of the two-to-one multiplexor 20. The select signal for the multiplexor 20 is obtained from the normal "SE" output of the flip-flop 45 to determine the transition point (clock signal rising or falling) in the signal applied on the lead 25, which constitutes the output signal from the DCO identified as the "PLL" output, since this circuit typically is used in a digital phase-locked loop.

The output of the flip-flop 61 also is applied to one of the two inputs of the NOR gate 65 to effect the transfer of the period count appearing on the leads 11 to the different stages 10A through 10F of the counter, thereby loading the counter with the next count to be operated on by the circuit.

At the end of each cycle of operation, the reset pulse is applied over the lead 28 to the other input of the NAND gate 65 to prevent any data transfer from occurring during the time this reset pulse is present. As stated previously, the reset pulse is applied to various ones of the flip-flops of the start-edge/stop-edge calculation logic and the state machine logic to return the system to an initial state of operation.

The foregoing description of the operation illustrates the manner in which the clocking of the oscillator frequency is effected on both edges of the clock signals to provide a significantly higher degree of resolution of the output signal appearing on the lead 25. FIG. 5 is an illustration of the waveforms appearing in different parts of the circuit shown in FIG. 4A. The different waveforms are provided with different letter designations correlated to the points in FIGS. 4A and 4B where these signals occur. Consequently, the operation of the circuit of FIG. 4A and 4B may be considered in conjunction with the waveform diagram of FIG. 5 to ascertain the state of in the waveform of FIG. 5. Movement through the machine states is shown, as well as the counter values.

Figure 5B:
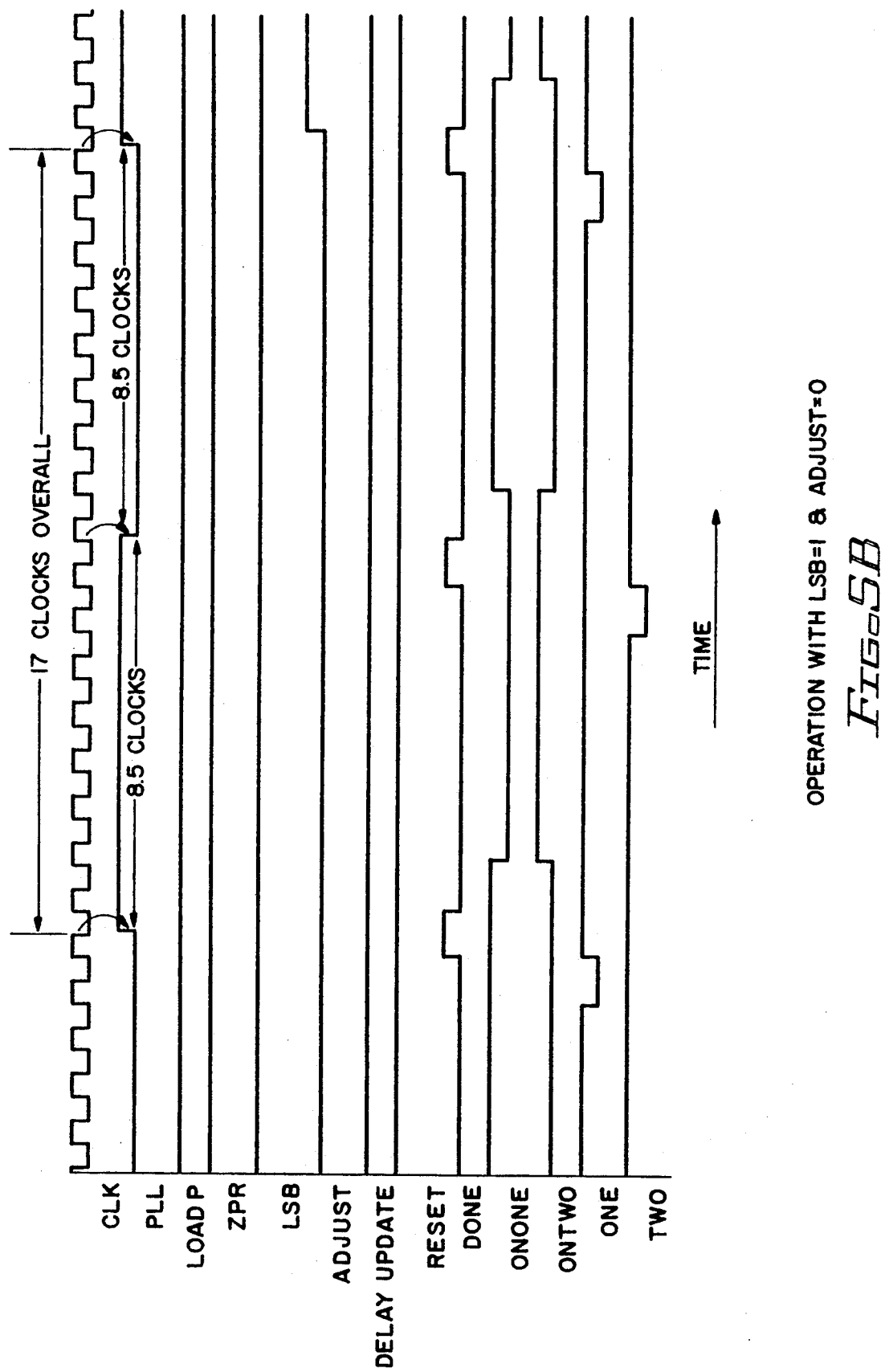

FIG. 5A illustrates the functioning of the DCO with the inputs D=001000 (8, ADJUST=0, and LSB=0). Hence the period of the output is 16 clocks (twice the input value D). A fifty percent duty cycle output is produced. FIGS. 5B and 5C illustrate the improved resolution obtained by the DCO described above. In FIG. 5B operation with LSB=1 and ADJUST=0 is shown. Note that the duty cycle is fifty percent, and that the period is 17 clocks (twice 8.5, the value D plus the ½ corresponding to the line LSB asserted) In FIG. 5C operation with LSB=1 and ADJUST=1 is shown. The duty cycle is off fifty percent by ¼ clock, as discussed previously. The period is 17.5 clocks, corresponding to twice 8.75, as LSB asserted indicates D+½ and ADJUST asserted indicates +¼, as discussed previously. Note that with LSB=0, the period would be 16.5 clocks (D+¼).

Figure 5D:
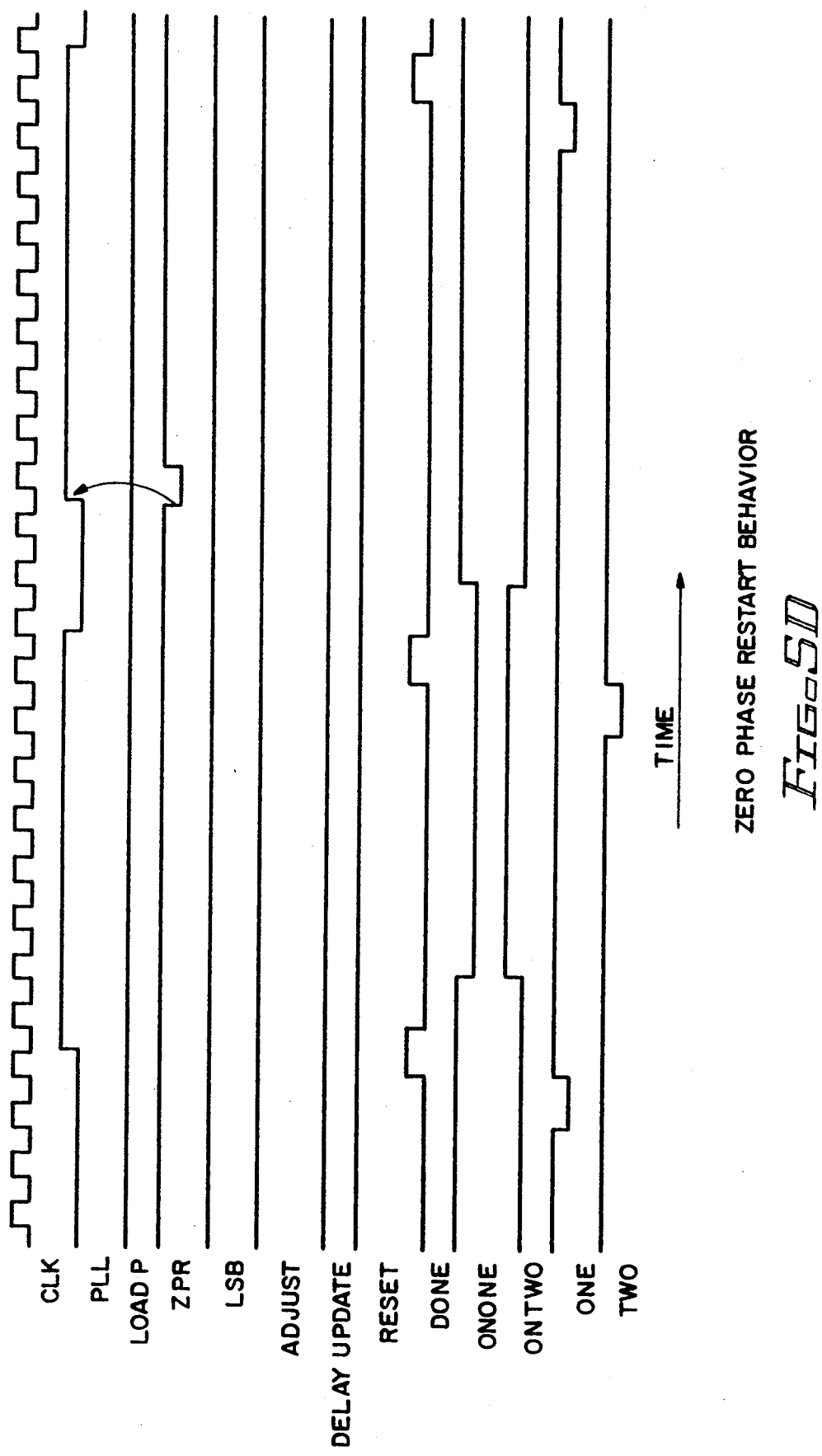
Figure 5E:
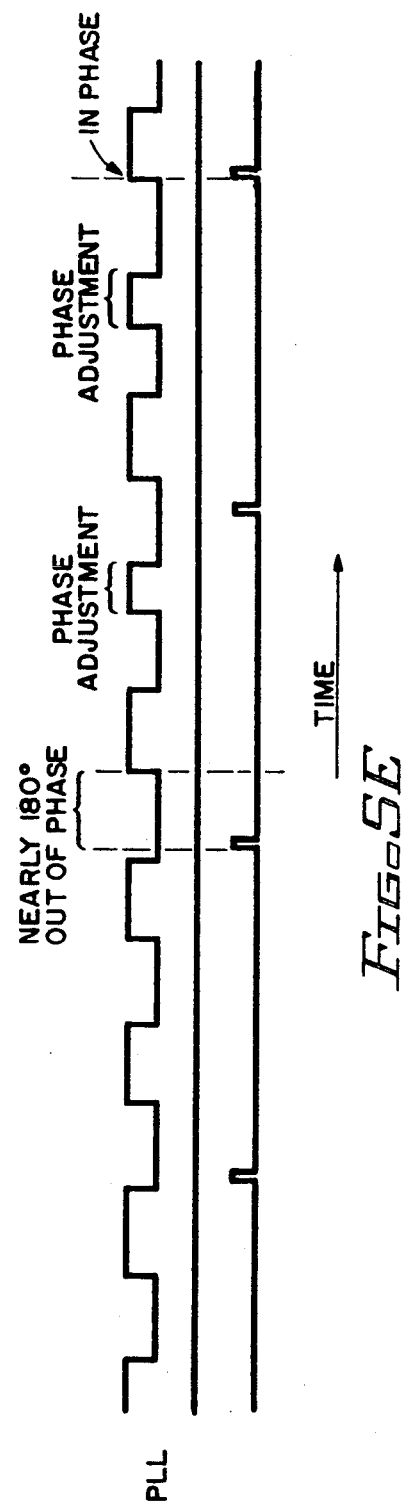

FIG. 5D illustrates the behavior of the DCO when the zero-phase restart signal ZPR-NOT is asserted. The current cycle is interrupted, and operation begins at the next clock. FIG. 5E illustrates the DCO behavior utilizing the phase adjust feature. Here the DCO, under control of a digital filter and included in an all-digital phase-locked loop, locks to the incoming signal through a series of phase adjustments. The waveforms which have been illustrated in FIGS. 5A through 5E all may be correlated with the detailed circuit diagram shown in FIG. 4, and serve to illustrate the manner of operation of that circuit.

The foregoing description of the preferred embodiment of the invention should be considered as illustrative, and not as limiting. Considerable flexibility is afforded to those skilled in the art without departing from the true scope of the invention, and the specific implementation of the circuit logic, to accomplish the desired result, may be varied from the embodiment illustrated without departing from the true scope of the invention, as defined in the appended claims.

I claim:

1. A high resolution digitally controlled oscillator including in combination:

a source of clock pulses, each having a rising edge and a falling edge;

a frequency divider circuit coupled with said source of clock pulses for providing an output signal having a changing binary state, which is predetermined division ratio of said clock pulses; and control means coupled with said frequency divider circuit for causing said frequency divider circuit to change the binary state of the output signal therefrom and therefore change the division ratio of said frequency divider circuit in response to selected ones of the rising edges and falling edges of said clock pulses to produce a high resolution output signal.

2. The combination according to claim 1 wherein said frequency divider circuit produces an output resolution at least equal to one-half the period of the clock pulses.

3. The combination according to claim 2 wherein said source of clock pulses produces clock pulses which are square-wave binary clock pulses.

4. The combination according to claim 3 wherein said frequency divider circuit has a division ratio which is a binary number with at least one binary decimal place.

5. The combination according to claim 4 wherein said binary number has two binary decimal places.

6. The combination according to claim 4 wherein said control means includes coincidence gate means responsive to the rising/falling edge of a clock pulse immediately preceding a current clock pulse, in conjunction with at least one other control signal indicative of the previous rising/falling edge of the clock signals used to produce an output signal transition from said frequency divider.

7. The combination according to claim 4 wherein the two low order bit values of the binary number, used for establishing the division ratio of said frequency divider circuit, comprise two binary decimal places, the highest order of which establishes the period of the output signal from said frequency divider, and whereas the lowest order binary decimal number is used to adjust the duty cycle of the output signal from the divider.

8. The combination according to claim 1 wherein said frequency divider circuit has a division ratio which is a binary number with at least one binary decimal place.

9. The combination according to claim 8 wherein the two low order bit values of the binary number, used for establishing the division ratio of said frequency divider circuit, comprise two binary decimal places, the highest order of which establishes the period of the output signal from said frequency divider, and whereas the lowest order binary decimal number is used to adjust the duty cycle of the output signal from the divider.

10. The combination according to claim 9 wherein said binary number has two binary decimal places.

11. The combination according to claim 1 wherein said control means includes coincidence gate means responsive to the rising/falling edge of a clock pulse immediately preceding a current clock pulse, in conjunction with at least one other control signal indicative of the previous rising/falling edge of the clock signals used to produce an output signal transition from said frequency divider.

12. The combination according to claim 11 wherein said source of clock pulses produces clock pulses which are square-wave binary clock pulses.

13. The combination according to claim 12 wherein said frequency divider circuit produces an output resolution at least equal to one-half the period of the clock pulses.

14. The combination according to claim 13 wherein the output resolution is at least equal to one-fourth the period of the clock pulses in applications not requiring a 50% duty cycle on the output.

15. A high resolution digitally controlled oscillator including in combination:

a source of clock pulses, each having a rising edge and a falling edge;

a frequency divider circuit coupled with said source of clock pulses for providing an output signal having a changing binary state, which is a predetermined division ratio of said clock pulses in the form of a binary number with at least two binary decimal places; and control means coupled with said frequency divider circuit for causing said frequency divider circuit to change the binary state of the output signal therefrom and therefore change the division ratio of said frequency divider circuit in response to selected ones of the rising edges and falling edges of said clock pulses to produce a high resolution output signal.

* * * * *